(12) United States Patent
Li

(10) Patent No.: US 12,191,170 B2
(45) Date of Patent: Jan. 7, 2025

(54) HEATER AND HEATING BASE

(71) Applicant: BEIJING NAURA MICROELECTRONICS EQUIPMENT CO., LTD., Beijing (CN)

(72) Inventor: Dongdong Li, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/174,336

(22) Filed: Feb. 24, 2023

(65) Prior Publication Data
US 2023/0223282 A1 Jul. 13, 2023

Related U.S. Application Data

(63) Continuation of application No. PCT/CN2021/114024, filed on Aug. 23, 2021.

(30) Foreign Application Priority Data

Aug. 25, 2020 (CN) .................. 202010862303.X

(51) Int. Cl.
*H01L 21/67* (2006.01)
*H05B 3/06* (2006.01)
*H05B 3/22* (2006.01)

(52) U.S. Cl.
CPC ......... *H01L 21/67103* (2013.01); *H05B 3/06* (2013.01); *H05B 3/22* (2013.01)

(58) Field of Classification Search
None
See application file for complete search history.

(56) References Cited

U.S. PATENT DOCUMENTS 4,872,835 A  10/1989 Tullis et al.
5,605,574 A   2/1997 Tsunashima et al.
(Continued)

FOREIGN PATENT DOCUMENTS

CN    1941317 A    4/2007
CN  101604654 A   12/2009
(Continued)

OTHER PUBLICATIONS

The World Intellectual Property Organization (WIPO) International Search Report for PCT/CN2021/114024 Nov. 11, 2021 5 Pages (including translation).

(Continued)

*Primary Examiner* — John J Norton
(74) *Attorney, Agent, or Firm* — ANOVA LAW GROUP, PLLC

(57) ABSTRACT

The present disclosure provides a heater and a heating base. The heater is used in a semiconductor process apparatus and includes a heating body and a base configured to support the heating body. The base includes a base body and a plate connected to each other. The base body is opposite to the heating body and arranged at an interval. The plate is arranged between the base body and the heating body and is fixedly connected to the heating body. An elastic bending structure is arranged on at least one of the plate, the base body, or the connection place between the plate and the base body. The elastic bending structure is configured to cause the plate and the heating body to remain connected by generating elastic deformation when the plate and the base body expand and deform.

20 Claims, 2 Drawing Sheets

(56) References Cited

U.S. PATENT DOCUMENTS

| | | | |
|---|---|---|---|
| 6,384,383 B2 * | 5/2002 | Kano | H01L 21/67103 |
| | | | 118/725 |
| 2001/0003334 A1 * | 6/2001 | Kano | H01L 21/67103 |
| | | | 219/548 |
| 2002/0153607 A1 * | 10/2002 | Hiramatsu | H01L 21/67103 |
| | | | 257/701 |
| 2003/0003749 A1 * | 1/2003 | Sexton | H01L 21/67103 |
| | | | 438/694 |
| 2009/0308537 A1 | 12/2009 | Shibuya et al. | |
| 2015/0223291 A1 | 8/2015 | Boguslavskiy et al. | |
| 2017/0278737 A1 | 9/2017 | Koiwa | |
| 2023/0223282 A1 * | 7/2023 | Li | H01L 21/67109 |
| | | | 219/444.1 |

FOREIGN PATENT DOCUMENTS

| | | | |
|---|---|---|---|
| CN | 102468208 A | | 5/2012 |
| CN | 103794538 A | | 5/2014 |
| CN | 112002658 A | | 11/2020 |
| CN | 112331609 A | | 2/2021 |
| EP | 0255247 A2 | | 2/1988 |
| JP | 2000100908 A | | 4/2000 |
| JP | 2014184450 A | * | 10/2014 |
| JP | 2018041778 A | * | 3/2018 |
| KR | 20060013773 A | | 2/2006 |
| KR | 20090130786 A | | 12/2009 |
| KR | 101074458 B1 | | 10/2011 |

OTHER PUBLICATIONS

The European Patent Office (EPO) The Extended European Search Report for 21860306.6 Sep. 9, 2024 8 Pages.

* cited by examiner

HEATER AND HEATING BASE

CROSS-REFERENCE TO RELATED APPLICATIONS

This application is a continuation of International Application No. PCT/CN2021/114024, filed on Aug. 23, 2021, which claims priority to Chinese Application No. 202010862303.X filed on Aug. 25, 2020, the entire contents of both of which are incorporated herein by reference.

TECHNICAL FIELD

The present disclosure generally relates to the semiconductor process apparatus technology field and, more particularly, to a heater and a heating base.

BACKGROUND

During a semiconductor processing process, a semiconductor is usually heated by a heater to cause a temperature of the semiconductor to reach a predetermined temperature to improve processing performance.

SUMMARY

The present disclosure provides a heater and a heating body to solve the problem that the expanded and deformed plate can be easy to have a connection failure with the heating disc, which causes the overall structural strength of the heater to be poor.

To solve the above problem, the present disclosure adopts the following technical solutions.

According to a first aspect, embodiments of the present disclosure provide a heater for a semiconductor process apparatus including a heating body and a base configured to support the heating body. The base includes a base body and a wall connected with each other. The base body and the heating body are arranged opposite to each other and at an interval. The wall is arranged between the base body and the heating body and fixedly connected to the heating body. An elastic bending structure is arranged on at least one of the wall, the base body, or a connection place between the wall and the base body. The elastic bending structure is configured to cause the wall and the heating body to remain connected by generating an elastic deformation when the wall and/or the base body expand to deform.

According to a second aspect, embodiments of the present disclosure provide a heating base, including an insulation disc, a bellows, and the heater according to the above embodiments. The first center hole is arranged in the base, and the insulation disc is arranged at the bottom of the base and is sealedly connected to the base to seal the first center hole. The second center hole corresponding to the first center hole is arranged in the insulation disc. The bellows is sealedly connected to a side of the insulation disc away from the heater to seal the second center.

The technical solutions adopted in the present disclosure can achieve the following beneficial effects.

Embodiments of the present disclosure provide a heater. The heater includes a heating body and a base. The base includes a base body and a wall connected to each other. The wall is arranged between the base body and the heating body and is fixedly connected to the heating body. The elastic bending structure is arranged on at least one of the wall, the base body, and the connection place between the wall and the base body. The elastic bending structure is configured to cause the wall and the heating body to remain connected by generating the elastic deformation when the wall and/or the base body is expanded and deformed. In the working process of the heater, even the heat is transferred to the wall to cause the wall to have a certain degree of expansion and deformation, the elastic bending structure can adaptively generate a certain elastic deformation to absorb the expansion force generated by the wall and/or the base body. Thus, the connection failure between the base and the heating body can be prevented, and the heater can be ensured to have a relatively high overall structural strength.

BRIEF DESCRIPTION OF THE DRAWINGS

The accompanying drawings described here are used to further understand the present disclosure and form a part of the present disclosure. Illustrative embodiments of the present disclosure and description of the embodiments are used to explain the present disclosure and are not used to limit the present disclosure. In the accompanying drawings.

REFERENCE NUMERALS

| 100 - Heating body | 110 - First through-hole | |
| 211 - Center member | 212 - Edge member | 213 - Second through-hole |
| 214 - Mounting groove | 215 - Cooling channel | 220 - Plate |
| 300 - Elastic bending structure | | |
| 410 - Elastic tube member | 420 - Flange | |
| 510 - Insulation disc | 520 - Bellows | 530 - Sealing ring |
| 540 - Insulation washer | 550 - Screw | 560 - First center hole |
| 570 - Second center hole | | |

DETAILED DESCRIPTION OF THE EMBODIMENTS

To make the purpose, technical solution, and advantages of the present disclosure clearer, the technical solution of the present disclosure will be described clearly and completely below in connection with specific embodiments of the present disclosure and accompanying drawings. Apparently, the described embodiments are only some embodiments of the present disclosure, but not all embodiments. Based on embodiments of the present disclosure, all other embodiments obtained by those of ordinary skill in the art without creative efforts are within the protection scope of the present disclosure.

The technical solutions disclosed by various embodiments of the present disclosure are described in detail below in connection with the accompanying drawings.

A heater usually includes a heating plate and a base configured to support the heating plate. The heating plate will generate heat when being charged. To reduce the heat of the heating plate from being transferred to the base, a wall is arranged at an edge of the base and configured to support the heating plate. A gap is formed between the heating plate and the base. The wall is usually connected to the heating plate in a welding manner. However, during an operation process of the heater, since the temperature of the heating plate is relatively high, a part of the heat is transferred to the wall, which causes the wall to expand and deform when. The connection between the expanded and deformed wall and the heating plate may fail.

Figure 1:
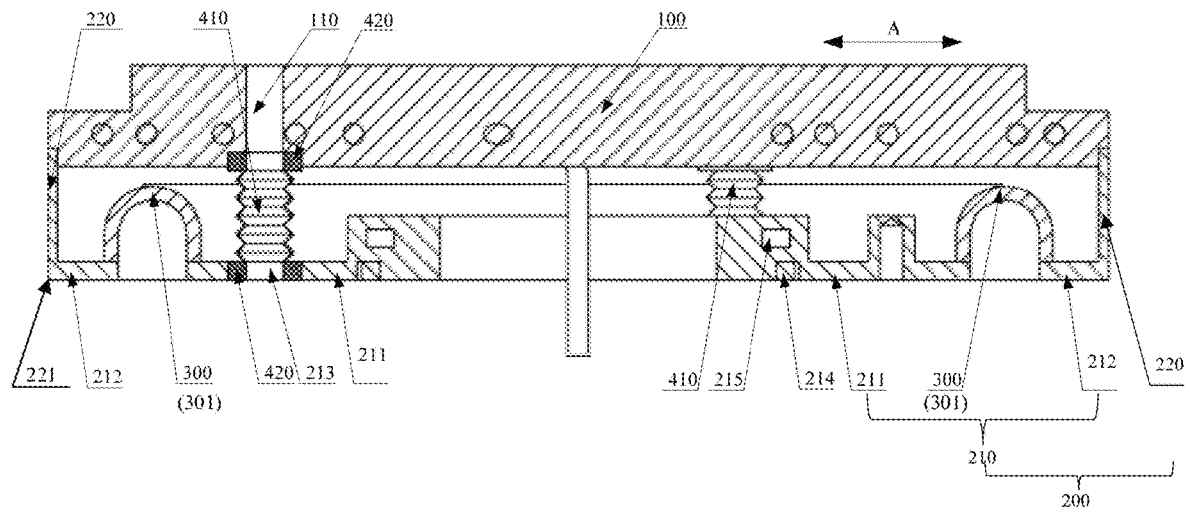
FIG. 1 illustrates a schematic structural diagram of a heater according to some embodiments of the present disclosure.
Figure 2:
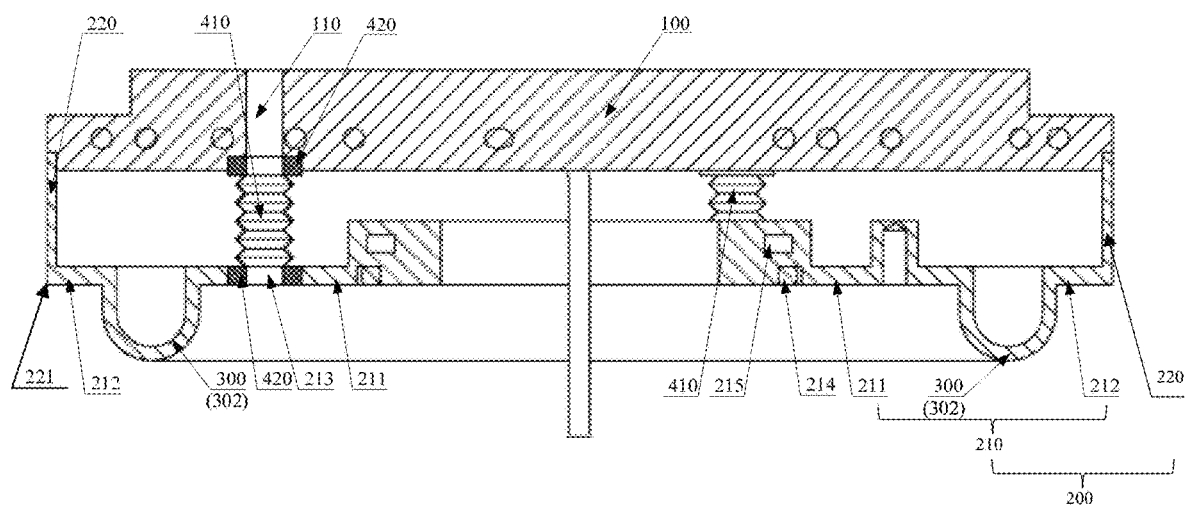
FIG. 2 illustrates a schematic structural diagram of another heater according to some embodiments of the present disclosure.

As shown in FIG. 1 and FIG. 2, embodiments of the present disclosure provide a heater, which is applied to a semiconductor process apparatus. The heater can be configured to carry and heat a to-be-processed workpiece in a semiconductor process. Thus, a temperature of the to-be-processed workpiece reaches a temperature required by the process to ensure that the processing process can be performed efficiently and reliably. The heater includes a heating body 100 and a base 200 configured to support the heating body 100. The base 200 includes a base body 210 and a wall 220 connected to each other.

The heating body 100 can be made of a material with good thermal conductivity such as metal. The heating body 100 can be connected to a power source through a conductive wire. Thus, the heating body 100 can generate heat in a charged state to provide a heating function. In some embodiments, the heating body 100 can be, for example, a plate body. The shape of the plate body can be square or circular. The thickness of the heating body 100 can be determined according to actual conditions.

The base body 210 can be arranged oppositely to the heating body 100 at an interval. With the interval, the heat of the heating body 100 can be reduced from being transferred to the base body 210 to ensure that the temperature of the heating body 100 is more consistent at different positions. Thus, the temperature of the to-be-processed workpiece can be uniform at different positions.

By arranging the wall 220 between the base body 210 and the heating body 100 and fixedly connecting the wall 220 to the heating body 100, the heating body 100 can be supported. At the same time, since the thickness of the wall 220 is relatively small, e.g., the wall 220 can have a thin-walled structure, a heat transfer cross-sectional area of the wall 220 can be reduced to lower the heat transfer efficiency between the heating body 100 and the wall 220. Thus, the heat of the heating body 100 transferred to the whole base 200 through the wall 220 can be further reduced to ensure that the temperature of the heating body 100 is substantially the same at any position.

In some embodiments, to ensure that the base 200 can provide reliable support for the heating body 100, both the base body 210 and the wall 220 can be made of materials with relatively high structural strength such as metal. The shape and size of the base body 210 can be correspondingly the same as the shape and size of the heating body 100. Optionally, the wall 220 can be connected to an outer edge of the base body 210. When the heating body 100 and the wall 220 are both made of metal materials, the wall 220 and the heating body 100 can be fixedly connected to each other by welding.

In some optional embodiments, the wall 220 can have a ring structure, and the thickness (i.e., a radial thickness) of the wall 220 can be between 2 mm-4 mm. Preferably, the shape of the wall 220 can be the same as the shapes of the outer edges of the heating body 100 and the base body 210 to increase the area of the region enclosed by the wall 220 as much as possible, improve an accommodation space for internal devices of the heater, and cause an outer structure of the whole heater to be more regular. For example, if the shapes of the outer edges of the heating body 100 and the base body 210 are rectangular, then the wall 220 can also have a rectangular ring structure. If the shapes of the outer edges of the heating body 100 and the base body 210 are a circular ring structure, the shape of the wall 220 can have circular ring structure. By causing the shape of the wall 220 to be the same as the shapes of the outer edges of the heating body 100 and the base body 210, the connection place 221 between the heating body 100 and the base body 210 can be more reliable.

At least one of the wall 220, the base body 210, and the connection place 221 between the wall 220 and the base body 210 can be provided with an elastic bending structure 300. The elastic bending structure 300 can be configured to generate an elastic deformation to maintain the connection between the wall 220 and the heating body 100 when the wall 220 and/or the base body 210 expand and deform. In the operation process of the above heater, even if the heat generated by the heating body 100 is transferred to the wall 220 to cause the wall 220 to expand and deform to a certain degree, the elastic bending structure 300 can also adaptively generate a certain elastic deformation by itself to absorb the expansion force generated by the wall 220 and/or the base body 210. Thus, the situation that the connection between the base 200 and the heating body 100 fails can be prevented. The heater can be ensured to have a relatively high overall structural strength.

In some optional embodiments, the elastic bending structure 300 can be configured to generate an elastic deformation in a first direction. The first direction can be parallel to a radial direction of the heating body 100, that is, direction A shown in FIG. 1. Direction A can generally be a main expansion and deformation direction of the wall 220 and/or the base body 210. When the wall 220 and/or the base body 210 generate expansion and deformation, the elastic bending structure 300 can generate an elastic deformation accordingly. Thus, the wall 220 can remain to be connected to the heating body 100. Preferably, the elastic bending structure 300 can be configured to generate the elastic deformation in both the first direction and a second direction. The second direction can be parallel to an axial direction of the heating body 100, that is, a direction perpendicular to direction A. Thus, no matter in which orientation the elastic bending structure 300 is combined with the base 200, the elastic bending structure 300 can provide the base 200 with a certain elastic deformation capability. Thus, installation flexibility can be improved to adapt to more application scenarios.

The elastic bending structure 300 can have various structures. For example, the elastic bending structure 300 can include at least one of at least one first bending member or at least one second bending member. The first bending member can protrude from a first reference surface toward a side in the interval between the base body 210 and the heating body 100. The first reference surface can be a surface of at least one of the wall 220, the base body 210, or the connection place 221 between the wall 220 and the base body 210 where the first bending member is located and opposite to the interval. For example, as shown in FIG. 1, the elastic bending structure 300 includes a first bending member, which is arranged at the base body 210. The base body 210 includes, for example, a center member 211 and an edge member 212. The edge member 212 can be arranged around the center member 211. The first bending member can be connected between the center member 211 and the edge member 212. The edge member 212 can be fixedly connected to the wall 220. In addition, the first bending member can protrude from the surface (i.e., the first reference surface) of the base body 210 where the first bending member is located and opposite to the interval toward the inner side of the interval. In some embodiments, the first bending member protrudes along the direction perpendicular to direction A in FIG. 1 toward the inner side of the interval. By causing the first bending member to protrude toward the inner side of the interval, the interval between the heating body 100 and the base body 210 can be effectively used. The first bending member does not need to occupy space outside the heater. A component and structure outside the heater can be prevented from generating a negative effect on the normal operation of the first bending member.

By causing the above first bending member to protrude toward the inner side of the interval along the direction perpendicular to direction A in FIG. 1, the direction of the elastic deformation of the first bending member is ensured to be perpendicular to the wall 220. Thus, the first bending member can absorb more lateral expansion force generated by the wall 220 and/or the base body 210 when being heated. In addition, since a main force causing the connection between the base 200 and the heating body 100 to fail is the lateral expansion force, with the first bending member with a smaller quantity and fewer types, no connection failure between the base 200 and the heating body 100 can be substantially ensured, and the processing difficulty of the heater can be reduced by causing the above first bending member to protrude toward the inner side of the interval along the direction perpendicular to direction A in FIG. 1.

In some optional embodiments, as shown in FIG. 1, the above first bending member is an annular bending member arranged around an axis of the heating body 100 and connected between the center member 211 and the edge member 212. The outer edge of the first bending member can be connected to an inner edge of the edge member 212. An inner edge of the first bending member can be connected to an outer edge of the center member 211. The outer edge of the edge member 212 can be connected to a lower edge of the wall 220 having the annular structure. An upper edge of the wall 220 can be connected to the outer edge of the heating body 100. Thus, in a process of the wall 220 and/or the base body 210 being heated to deform, the first bending member of the above structure can provide a better elastic deformation capability. Thus, the connection failure between the wall 220 and the heating body 100 can be prevented to ensure that the connection between the heating body 100 and the base 200 is more reliable.

In some optional embodiments, a gap can be arranged between the above first bending member and the heating body 100 to prevent the heat of the heating body 100 from being easily transferred to the first bending member due to the contact between the first bending member and the heating body 100 to cause the temperature of the position of the heating body 100 corresponding to the first bending member to be lower than the temperature of other positions of the heating body 100, which causes the heater to be not able to provide a consistent heating effect for different positions of the to-be-processed workpiece.

The structure of the second bending member can be the same as the structure of the above first bending member, only with an opposite a protruding direction. In some embodiments, the second bending member can protrude from a second reference surface toward a side away from the interval between the base body 210 and the heating body 100. The second reference surface can be at least one of the wall 220, the base body 210, and the connection place 221 between the wall 220 and the base body 210 where the second bending member is located and away from the interval. For example, as shown in FIG. 2, the elastic bending structure 300 includes a second bending member, which is connected between the center member 211 and the edge member 212 of the base body 210 and protrudes from the surface (i.e., the second reference surface) of the base body 210 where the second bending member is located away from the interval toward the side away from the interval. Optionally, the second bending member can be an annular bending member arranged around the axis of the heating body 100.

By causing the above second bending member to protrude toward the side away from the interval along the direction perpendicular to direction A in FIG. 1 and ensuring that the elastic deformation direction of the second bending member is perpendicular to the wall 220, the second bending member can absorb more lateral expansion force generated by the wall 220 and/or the base body 210 when being heated. In addition, since the main force that causes the connection failure between the base 200 and the heating body 100 is the lateral expansion force, by causing the second bending member to protrude along the direction perpendicular to direction A in FIG. 1 toward the side away from the interval, no connection failure between the base 200 and the heating body 100 can be substantially ensured with a smaller quantity and fewer types of the second bending member, and the processing difficulty of the heater can be reduced.

In addition, by arranging the elastic bending structure 300 at the base body 210, the wall 220 can have an integral structure. Thus, the wall 220 can be ensured to have relatively high structural strength and supporting reliability. The connection difficulty between the base body 210 and the wall 220 can also be reduced. By causing the elastic bending structure 300 to be located at the base body 210 and causing a certain gap between the elastic bending structure 300 and the wall 220 in a direction perpendicular to the wall 220, the wall 220 can be prevented from limiting the elastic bending structure 300 to generate deformation. By adopting the above technical solutions, the lateral expansion force generated by the base body 210 itself can be absorbed to a certain degree with the help of the elastic bending structure 300. Thus, the negative impact on the connection relationship between the wall 220 and the base body 100 due to the expansion of the base body 210 can be further reduced. Further, by causing one of the above first bending member and the second bending member to protrude along the direction perpendicular to direction A in FIG. 1, the elastic deformation direction of one of the first bending member and the second bending member can be caused to be perpendicular to the wall 220. Thus, the lateral expansion force generated by the wall 220 and the base body 210 when being heated can be substantially and fully absorbed by the elastic bending structure 300 to ensure that the connection between the base 200 and the heating body 100 is not easy to fail.

It should be noted that no matter whether the elastic bending structure 300 is arranged at the wall 220, the base body 210, or at the connection place 221 between the wall 220 and the base body 210, the elastic bending structure 300 cannot directly contact the heating body 100. That is, one of the wall 220 and the base body 210 can be used to isolate the heating body 100 and the elastic bending structure 300 to reduce the heat of the heating body 100 transferred to the elastic bending structure 300 as much as possible. Thus, an expansion amplitude generated by the elastic bending structure 300 when being heated can be caused to be smaller to absorb the expansion force generated by the wall 220 and/or the base body 210 when being heated as much as possible. Thus, the connection between the base 200 and the heating body 100 can be ensured to have higher reliability.

The respective structures of the first bending member and the second bending member can have any bending structures that are capable of generating the elastic deformation. For example, in some optional embodiments, an orthographic projection shape of the first bending member at an axial cross-section (i.e., the cross-section shown in FIG. 1 and FIG. 2) of the heating body 100 includes a U shape. An orthographic projection shape of the second bending member at the axial cross-section of the heating body 100 can include a U shape. Since the U-shaped bending structure is a smooth transition structure, the elastic capability of the above first bending member and the second bending member can be stronger. The situation that the first bending member and the second bending member cannot restore the deformation and even can be broken can be more difficult to happen when being subjected to a larger expansion force. Of course, in practical applications, the above smooth transition structure is not limited to the U-shape, and the present disclosure has no special limitation to this.

It should be noted that the present disclosure is not limited to the first bending member and the second bending member in FIG. 1 and FIG. 2, any quantity of first bending members and any quantity of second bending members can be freely grouped and distributed on at least one of the wall 220, the base body 210, and the connection place 221 between the wall 220 and the base body 210 according to specific needs. Moreover, the present disclosure has no special limitation on specific size parameters of the first bending member and the second bending member. In addition, the structures and sizes of different bending members can be the same or different. In addition, two neighboring bending members can be connected to each other or can be arranged at intervals from each other, which is not limited here.

It should also be noted that the present disclosure is not limited to arranging one of the first bending member and the second bending member between the center member 211 and the edge member 212 of the base body 210. In practical applications, one of the first bending member and the second bending member can also be arranged at the wall 220. The protrusion directions of the first bending member and the second bending member can be parallel to or have an angle with direction A in FIG. 1; and/or one of the first bending member and the second bending member can be arranged at the connection between the wall 220 and the base body 210, and the protrusion directions of the first bending member and the second bending member can be perpendicular to or have an angle with direction A in FIG. 1. By taking the first bending member being arranged at the connection place 221 between the wall 220 and the base body 210 as an example, the outer edge of the first bending member can be connected to the lower edge of the wall 220 having the annular structure. The inner edge of the first bending member can be connected to the outer edge of the base body 210. The upper edge of the wall 220 having the annular structure can be connected to the outer edge of the heating body 100.

In addition, it should be noted that the elastic bending structure 300 is not limited to the first bending member and the second bending member shown in FIG. 1 and FIG. 2. The elastic bending structure 300 can be any elastic member that can generate the elastic deformation. By taking the elastic member as a specific structure of a spring as an example, the spring can generate a retractable deformation along an axial direction and can generate a lateral displacement along a radial direction. No matter with which orientation the spring is combined with the base 200, the spring can provide a certain degree of elastic deformation capability for the base 200 to improve the installation flexibility to adapt to more application scenarios.

In some optional embodiments, the elastic bending structure 300 can be formed by sheet metal technology; or, the elastic bending structure 300 can be formed by using a metal plate in advance, and then the elastic bending structure 300 can be fixedly connected to at least one of the wall 220, the base body 210, or the connection place 221 of the wall 220 and the base body 210 in a welding manner. For example, when the elastic bending structure 300 is located at the connection place 221 between the wall 220 and the base body 210, three individual parts of the wall 220, the base body 210, and the elastic bending structure 300 can be pre-formed. Two ends of the elastic bending structure 300 can be connected to the wall 220 and the base body 210 in the welding manner to cause the three individual parts to form an integral structure. When the elastic bending structure 300 is located at the wall 220 or the base body 210, the wall 220 or the base body 210 can form two individual parts. The two ends of the elastic bending structure 300 can be connected to the two individual parts of the wall 220 or the base body 210, respectively. Thus, the two individual parts of the wall 220 or the base body 210 can form an integral structure with the elastic bending structure 300.

In some optional embodiments, the base body 210 and the elastic bending structure 300 can be integrally formed. For example, the elastic bending structure 300 can be formed at a predetermined position of a base material of an integral structure in a sheet metal manner. The remaining part of the base material is the base body 210. Two parts of the base body 210 that are located on an outer side and an inner side of the elastic bending structure 300 can be, i.e., the center member 211 and the edge member 212, respectively. The center member 211 can be connected to the edge member 212 through the elastic bending structure 300. The edge member 212 can be fixedly connected to the heating body 100 through the wall 220. Alternatively, the center member 211, the edge member 212, and the elastic bending structure 300 can be formed individually. Then, edge member 212, and the elastic bending structure 300 can be connected together in the welding manner. Thus, the elastic bending structure 300 can be fixed at the base body 210. In some embodiments, the size of the edge member 212 can be determined according to the actual needs, which is not limited here.

Obviously, when the elastic bending structure 300 is located on the base body 210, the elastic bending structure 300 can also be an annular structural member, which can ensure that the elastic bending structure 300 and the wall 220 have relatively high connection reliability with the whole base body 210. In addition, the elastic bending structure 300 can also be caused to adsorb the lateral expansion force at positions of the base body 210 along the periphery of the elastic bending structure 300. Thus, the connection between the base 200 and the heating body 100 can be further ensured not to fail when the base body 210 and/or the wall 220 is heated.

As mentioned above, the base body 210 can be connected to the heating body 100 through the wall 220. The base body 210 and the heating body 100 can be arranged at an interval to reduce the heat of the heating body 100 transferred to the base body 210. When the elastic bending structure 300 is arranged at the base body 210, to further reduce the heat of the heating body 100 transferred to the base 200, in some embodiments, a thickness value of the wall of the elastic bending structure 300 can be d, and 2 mm≤d≤4 mm. Optionally, when the base body 210 includes the edge member 212, a wall thickness of the edge member 212 can also meet the above requirements. Thus, the heat transfer efficiency between the wall 220 and the base body 210 by reducing the cross-sections of the edge member 212 and the elastic bending structure 300. The heat of the heating body 100 can be further prevented from being transferred to the base 200 too much. Thus, the temperature of the heating body can be ensured to be substantially the same at any position, and the heating body 100 can provide a heating function to the to-be-processed workpiece uniformly.

In addition, to ensure that the heater is not grounded during operation, an insulation disc 510 can be arranged on a side of the base 200 of the heater of embodiments of the present disclosure away from the heating body 100. The insulation disc 510 can be made of an insulation material, e.g., ceramics. The insulation disc 510 can be configured to ensure that the heater is at a floating potential. The insulation disc 510 and the base 200 can be fixed to each other by screws. To isolate the inner space of the heater, a sealing ring 530 can usually be arranged between the base 200 and the insulation disc 510.

In some embodiments, an installation groove 214 can be arranged on a side of the base 200 away from the heating body 100, that is a surface of the base body 210 away from the heater 100. The sealing ring 530 can be accommodated in the installation groove 214. By causing a cross-section of the sealing ring 530 to be larger than a cross-section of the installation groove 214, the sealing ring 530 can be squeezed and installed in the installation groove 214 with a compression force between the base 200 and the insulation disc 510. Thus, the base 200 and the insulation disc 510 can form a sealing cooperation relationship.

The sealing ring 530 can usually be made of an elastic material such as rubber. During the working process of the heater, a part of the heat generated by the heating body 100 can be transferred to the base 200. To ensure that the sealing ring 530 is not impacted by a high temperature to deform or even be damaged, a cooling channel 215 can usually be arranged at a position corresponding to the installation groove 214. When the heater is working, by supplying a cooling fluid such as water into the cooling channel 215, a cooling and lowering temperature function can be provided to the area where the sealing ring 530 is located in the base 200. Thus, the sealing ring 530 can provide a sealing effect lastly.

Based on the above embodiment, by arranging the elastic bending structure 300 at the base body 210 and causing the thicknesses of the elastic bending structure 300 and the edge member 212 to be relatively small, the heat of the heating body 100 can be more difficult to be transferred to the base body 210 through the wall 220. Thus, the temperature at the area where the sealing ring 530 is located in the base body 210 can be further ensured to be relatively low to increase a sealing effect and service life of the sealing ring 530.

Further, a first through-hole 110 can be arranged in the heating body 100. A second through-hole 213 corresponding to the first through-hole 110 can be arranged at the base body 210. The first through-hole 110 and the second through-hole 213 can be configured for a pin to pass through. During the working process of the heater, the pin can be extended from one side of the heater to another side of the heater through the first through-hole 110 and the second through-hole 213. Thus, when the heater is descended, the to-be-processed workpiece can be supported by the pin to ensure that the to-be-processed workpiece does not fall off. Since the air pressure of the space between the heating body 100 and the base body 210 in the heater is close to the atmosphere pressure, and the side where the heating body of the heater is located must be a vacuum environment, to isolate the space inside the heater from the side where the heating body 100 is located, the heater can further include an elastic tube member 410. Two ends of the elastic tube member 410 can be sealedly connected to the heating body 100 and the base body 210 and configured to seal the first through hole 110 and the second through-hole 213. The elastic tube member 410 can have a tube-shaped structure. An elastic direction of the elastic tube member 410 can be consistent with the axial direction of the first through-hole 110 to ensure that the inner space of the heater is not communicated with the space on the side where the heating body 100 is located.

Meanwhile, since the two opposite ends of the elastic tube member 410 are connected to the heating body 100 and the base body 210, respectively, the heat of the heating body 100 can be transferred to the elastic tube member 410. By causing the elastic direction of the elastic tube member 410 to be consistent with the axial direction of the first through-hole 110, the connection between the elastic tube member 410 and the heating body 100 and between the elastic tube member 410 and the base body 210 can be ensured to have a relatively high reliability. In addition, when the elastic tube member 410 with the above structure is used to connect the heating body 100 and the base body 210, a certain lateral relative displacement can be generated between the two opposite ends of the elastic tube member 410, which further prevents the vacuum from failing at the side where the heating body 100 is located.

In some embodiments, the elastic tube member 410 can be a metal tube member. The two opposite ends of the elastic tube member 410 can be fixed at the heating body 100 and the base body 210 by welding, respectively. Optionally, annular flanges 420 can be arranged at the two opposite ends of the elastic tube member 410 to improve the connection reliability between the elastic tube member 410 with the heating body 100 and the base body 210.

In some optional embodiments, the elastic tube member 410 can include a plurality of annular elastic rings. In some embodiments, the elastic rings can be steel rings. The plurality of elastic rings can be sequentially connected along the axial direction of the elastic tube member to form a continuous tube member. Any two neighboring elastic rings can be configured to be able to be folded or unfolded along the axial direction of the elastic tube member. In practical applications, the length of the elastic ring and an angle between the two neighboring rings can be determined according to actual requirements.

In addition, when a plurality of first through-holes 110 and a plurality of second through-holes 213 are provided, a plurality of elastic tube members 410 can also be provided. Thus, each first through-hole 110 can be sealedly connected to each second through-holes 213 through an elastic tube member 410.

Optionally, the elastic bending structure 300 can be located between the elastic tube member 410 and the wall 220. That is, based on the base body 210, the elastic bending structure 300 can be more close to outward than the elastic tube member 410. Since the temperature of the part of the base body 210 that is closer to the heating body 100 is higher, and the base body 210 is connected to the heating body 100 through the wall 220, the temperature of the part of the base body 210 that is closer to the plate is usually higher. Thus, by adopting the above technical solution, when the wall 220 and/or the base body 210 is heated to generate the lateral expansion force, the elastic bending structure 300 can adsorb more lateral expansion force. Thus, the elastic tube member 410 can adsorb the lateral expansion force as little as possible. Thus, the elastic tube member 410 can have a smaller lateral displacement between the opposite two ends. Thus, the connection reliability between the elastic tube member 410 with the heating body 100 and the base body 210 can be ensured to be relatively high.

In addition, based on the above embodiments, when the annular elastic bending structure 300 is located at the base body 210, the lateral expansion force acting on the elastic tube member 410 can be further reduced to ensure higher structural stability of the elastic tube member 410.

As mentioned above, the heat of the heating body 100 can also be transferred to the elastic tube member 410. Optionally, the elastic tube member 410 can be a stainless steel structure. That is, the elastic ring can be made of a stainless steel material. The wall thickness of the elastic ring can be less than 0.15 mm. When the elastic tube member 410 of the above material adopts the above size, the heat of the heating body 100 that is transferred to the base 200 through the elastic tube member 410 can be ensured to satisfy the process requirements, will not generate a negative impact on the heating effect of the heating body 100, can ensure that the elastic tube member 410 has the required structural strength, and ensure that the inner space of the heater is isolated from the external space. Of course, those skilled in the art can select another material to form the elastic tube member 410 according to the basic requirements of the above embodiments, and correspondingly determine the wall thickness of the elastic tube member 410 according to a thermal conductivity of the selected material. Thus, the heat of the heating body 100 that is transferred to the base 200 through the elastic tube member 410 can be ensured to satisfy the process requirements.

Figure 3:
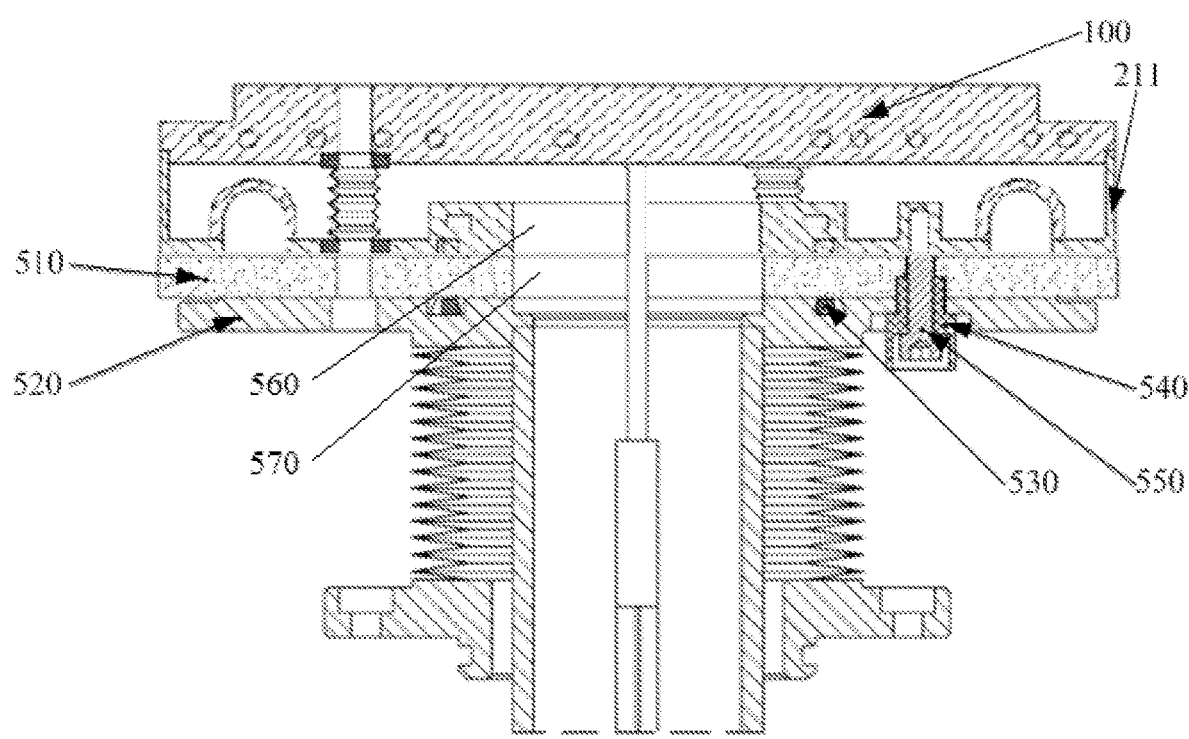
FIG. 3 illustrates a schematic structural diagram of a heating base according to some embodiments of the present disclosure.

Based on the heater of any of the above embodiments, as shown in FIG. 3, embodiments of the present disclosure also provide a heating base. The heating base includes an insulation disc 510, a bellows 520, and any one of the above heaters. A first center hole 560 is arranged in the base 200 of the heater. The insulation disc 510 can be arranged at the bottom of the base 200 and sealedly connected to the base 200 to seal the first center hole 560. Moreover, a second center hole 570 opposite to the first central hole 560 is arranged in the insulation disc 510. The bellows 520 can be sealedly connected to a side of the insulation disc 510 away from the heater to seal the second center hole 570.

In some embodiments, similar to the above embodiments, an installation groove 214 can be arranged on the side of the base away from the heating body 100. A sealing ring 530 can be arranged in the installation groove 214. Thus, the purpose of sealing the base 200 and the insulation disc 510 can be achieved with the sealing ring 530. The bellows 520 can be sealedly connected to the side of the insulation disc 510 away from the heating body 100. Similarly, the bellows 520 can also achieve the purpose of being sealedly connected to the insulation disc 510 by the sealing ring 530. In some embodiments, a concave groove structure similar to the installation groove 214 can be arranged on a side surface of the bellows 520 facing the insulation disc 510. By arranging the sealing ring 530 in the concave groove structure, after the bellows 520 and the insulation disc 510 are assembled to be an integral structure, the sealed connection relationship between the bellows 520 and the insulation disc 510 can also be ensured.

In addition, the bellows 520, the insulation disc 510, and the heater can be assembled by screws 550. By causing the screws 550 to pass through the bellows 520 and the insulation disc 510 and be connected to the base 200 of the heater, the bellows 520, the insulation disc 510, and the heater can be ensured to form a stable and reliable fixed connection relationship. Moreover, to ensure that the heater is at the floating potential, an insulation washer 540 can be arranged between the screw 550 and the screw hole.

The above embodiments of the present disclosure focus on the differences between various embodiments. As long as the different optimization features of the embodiments are not contradictory, the optimization features can be combined to form a better embodiment, which is not repeated here considering the brevity of the text.

The above descriptions are only embodiments of the present disclosure and are not used to limit the present disclosure. For those skilled in the art, various modifications and variations can be made to the present disclosure. Any modification, equivalent replacement, improvement, etc., made within the spirit and principle of the present disclosure shall be included within the scope of the appended claims of the present disclosure.

What is claimed is:

1. A heater for a semiconductor process apparatus comprising:
    a heating body; and
    a base configured to support the heating body and including:
        a base body arranged at a distance from the heating body; and
        a wall connected to the base body, arranged between the base body and the heating body, and fixedly connected to the heating body, an elastic bending structure being arranged on the base body and being configured to generate an elastic deformation to maintain the connection between the wall and the heating body when the wall and/or the base body expand to deform.

2. The heater according to claim 1, wherein:
    the elastic bending structure is configured to generate the elastic deformation either in a first direction or in the first direction and in a second direction;
    the heating body is in a circular shape;
    the first direction is parallel to a radial direction of the heating body; and
    the second direction is parallel to an axial direction of the heating body.

3. The heater according to claim 1, wherein the elastic bending structure includes at least one of:
    a first bending member protruding from a first reference surface toward a side inside the interval between the base body and the heating body, the first reference surface being a surface of the base body, where the first bending member is located opposite to the interval; and
    a second bending member protruding from a second reference surface toward a side away from the interval between the base body and the heating body, the second reference surface being a surface of the base body, where the second bending member is located away from the interval.

4. The heater according to claim 3, wherein:
a shape of an orthographic projection of the first bending member on an axial cross-section of the heating body includes a U shape; and
a shape of an orthographic projection of the second bending member on the axial cross-section of the heating body includes a U shape.

5. The heater according to claim 3, wherein:
the first bending member is an annular bending member arranged around an axis of the heating body; and
the second bending member is an annular bending member arranged around the axis of the heating body.

6. The heater according to claim 3, wherein:
in response to the elastic bending structure including the first bending member, the base body includes:
a center member; and
an edge member arranged around the center member and fixedly connected to the wall, the first bending member being connected between the edge member and the center member.

7. The heater according to claim 3, wherein a gap is arranged between the first bending member and the heating body.

8. The heater according to claim 1, wherein a wall thickness of the elastic bending structure is d, wherein 2 mm≤d≤4 mm.

9. The heater according to claim 1, wherein:
a first through-hole is arranged in the heating body, a second through-hole opposite to the first through hole is arranged in the base body, and the first through-hole and the second through-hole are configured for a pin to pass through; and
the heater further includes an elastic tube member, two ends of the elastic tube member are sealedly connected to the heating body to seal the first through-hole and the second through-hole, respectively.

10. The heater according to claim 9, wherein the elastic bending structure is arranged at the base body and between the elastic tube member and the wall.

11. The heater according to claim 9, wherein the elastic tube member includes:
a plurality of annular elastic rings sequentially connected along an axial direction of the elastic tube member to form a continuous tube member, any two neighboring elastic rings being configured to be folded or unfolded along the axial direction of the elastic tube member.

12. The heater according to claim 11, wherein a wall thickness of an elastic ring of the plurality of annular elastic rings is less than 0.15 mm.

13. A heating base comprising:
a heater including:
a heating body; and
a base configured to support the heating body and including:
a base body arranged at a distance from the heating body, a first center hole being arranged in the base; and
a wall connected to the base body, arranged between the base body and the heating body, and fixedly connected to the heating body, an elastic bending structure being arranged on the base body and being configured to generate an elastic deformation to maintain the connection between the wall and the heating body when the wall and/or the base body expand to deform;
an insulation disc arranged at a bottom of the base and sealedly connected to the base to seal the first center hole, a second center hole corresponding to the first center hole being arranged in the insulation disc; and
a bellows sealedly connected to a side of the insulation disc away from the heater to seal the second center hole.

14. The heating base according to claim 13, wherein:
the elastic bending structure is configured to generate the elastic deformation either in a first direction or in the first direction and in a second direction;
the heating body is in a circular shape;
the first direction is parallel to a radial direction of the heating body; and
the second direction is parallel to an axial direction of the heating body.

15. The heating base according to claim 13, wherein the elastic bending structure includes at least one of:
a first bending member protruding from a first reference surface toward a side inside the interval between the base body and the heating body, the first reference surface being a surface of the base body, where the first bending member is located opposite to the interval; and
a second bending member protruding from a second reference surface toward a side away from the interval between the base body and the heating body, the second reference surface being a surface of the base body, where the second bending member is located away from the interval.

16. The heating base according to claim 15, wherein:
a shape of an orthographic projection of the first bending member on an axial cross-section of the heating body includes a U shape; and
a shape of an orthographic projection of the second bending member on the axial cross-section of the heating body includes a U shape.

17. The heating base according to claim 15, wherein:
the first bending member is an annular bending member arranged around an axis of the heating body; and
the second bending member is an annular bending member arranged around the axis of the heating body.

18. The heating base according to claim 15, wherein:
in response to the elastic bending structure including the first bending member, the base body includes:
a center member; and
an edge member arranged around the center member and fixedly connected to the wall, the first bending member being connected between the edge member and the center member.

19. The heating base according to claim 15, wherein a gap is arranged between the first bending member and the heating body.

20. The heating base according to claim 13, wherein a wall thickness of the elastic bending structure is d, wherein 2 mm≤d≤4 mm.

* * * * *